(12) United States Patent  
Lee et al.

(10) Patent No.: US 7,338,863 B2
(45) Date of Patent: Mar. 4, 2008

(54) SEMICONDUCTOR MEMORY DEVICE AND METHOD OF MANUFACTURING THE SEMICONDUCTOR MEMORY DEVICE

(75) Inventors: Jong-Cheol Lee, Seoul (KR); Jae-Hyoung Choi, Gwangmyeong-si (KR); Han-Mei Choi, Seoul (KR); Gab-Jin Nam, Seoul (KR); Young-Sun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 11/311,143

(22) Filed: Dec. 20, 2005

(65) Prior Publication Data

US 2006/0138523 A1    Jun. 29, 2006

(30) Foreign Application Priority Data

Dec. 20, 2004  (KR) ............... 10-2004-0108624

(51) Int. Cl.
*H01L 21/336* (2006.01)
(52) U.S. Cl. ............... 438/261; 438/591; 257/E21.209; 257/E21.681
(58) Field of Classification Search ............... 438/257, 438/261, 591, 593; 257/E21.209, E21.681
See application file for complete search history.

(56) References Cited

U.S. PATENT DOCUMENTS 6,642,573 B1* 11/2003 Halliyal et al. ............. 257/316

2002/0137317 A1* 9/2002 Kaushik et al. ............. 438/585
2004/0201058 A1* 10/2004 Sonoda et al. ............. 257/314

FOREIGN PATENT DOCUMENTS

| KR | 1998-032692 | 7/1998 |
| KR | 1999-77767 | 10/1999 |
| KR | 2000-23760 | 4/2000 |

OTHER PUBLICATIONS

Korean Patent Office Action dated May 18, 2006.

* cited by examiner

*Primary Examiner*—Trung Dang
(74) *Attorney, Agent, or Firm*—Harness, Dickey & Pierce, P.L.C.

(57) ABSTRACT

Example embodiments of the present invention disclose a non-volatile semiconductor memory device, which may include a dielectric layer having an enhanced dielectric constant. A tunnel oxide layer pattern and a floating gate may be sequentially formed on a substrate. A dielectric layer pattern including metal oxide doped with Group III transition metals may be formed on the floating gate using a pulsed laser deposition process. The dielectric layer pattern having an increased dielectric constant may be formed of metal oxide doped with a transition metal such as scandium, yttrium, or lanthanum.

12 Claims, 6 Drawing Sheets

SEMICONDUCTOR MEMORY DEVICE AND METHOD OF MANUFACTURING THE SEMICONDUCTOR MEMORY DEVICE

PRIORITY STATEMENT

A claim of priority is made to Korean Patent Application No. 2004-108624 filed on Dec. 20, 2004, the contents of which are herein incorporated by reference in their entirety.

BACKGROUND OF THE INVENTION

1. Field of the Invention

Example embodiments of the present invention relate to semiconductor memory devices and methods of manufacturing the semiconductor memory devices. More particularly, example embodiments of the present invention relate to non-volatile semiconductor memory devices including a dielectric layer having a high dielectric constant, and methods of manufacturing the same.

2. Description of the Related Art

Semiconductor memory devices may be generally divided into volatile semiconductor memory devices and non-volatile semiconductor memory devices. Volatile semiconductor memory devices such as a dynamic random access memory (DRAM) device or a static random access memory (SRAM) device lose data stored therein when power is turned off. Non-volatile semiconductor memory devices such as flash memory devices and Read-only memory (ROM) have the ability to maintain data stored therein even when power is turned off. Recently, demand for flash memory devices has increased.

In general, a flash memory device may have a memory cell to store data. The memory cell may have a stacked gate structure, including a floating gate formed by forming a tunnel oxide layer on a silicon substrate, and a control gate formed by forming a dielectric layer on the floating gate. Data may be stored in the memory cell by injecting electrons into the floating gate and extracting electrons from the floating gate by applying appropriate voltages to the control gate and the substrate. The dielectric layer may maintain electrical characteristics of charges that may be stored in the floating gate, and may allow voltage of the control gate to flow to the floating gate.

FIG. 1 is a cross-sectional view illustrating a non-volatile semiconductor memory device of the prior art.

Referring to FIG. 1, the non-volatile semiconductor memory device may include a tunnel oxide layer 15 formed on a semiconductor substrate 10 having an isolation layer (not shown). A floating gate 20 may be formed on the tunnel oxide layer 15, a dielectric layer 40 having an ONO (Oxide/Nitride/Oxide) structure may be formed on the floating gate 20, and a control gate 45 may be formed on the dielectric layer 40. The dielectric layer 40 may have a sequentially stacked first oxide layer 25, nitride layer 30, and second oxide layer 35. The floating gate 20 and the control gate 45 may be formed of polysilicon.

The non-volatile semiconductor memory device may store data by injecting electrons into the floating gate 20 or extracting electrons from the floating gate 20 by applying appropriate voltages to the control gate 45 and the semiconductor substrate 10. The dielectric layer 40 may maintain electrical characteristics of charges that may be stored in the floating gate 20, and allow the voltage of the control gate 45 to flow to the floating gate 20. However, in the case of the non-volatile semiconductor memory device having an ONO structure as described above, the dielectric layer may have multiple layers of the oxide layer and the nitride layer, which may create insufficient dielectric constant required for the non-volatile semiconductor memory device. Such a structure may require complicated processes to form the dielectric layer. Additionally, stacking the multiple layers to form the dielectric layer may increase a thickness of the dielectric layer.

Conventional art discloses a semiconductor device which may include a dielectric layer formed of aluminum oxide ($Al_2O_3$), yttrium oxide ($Y_2O_3$), tantalum pentoxide ($Ta_2O_5$) or vanadium pentoxide ($V_2O_5$) doped with Group IV elements, such as zirconium (Zr), silicon (Si), titanium (Ti) and hafnium (Hf). Conventional art also discloses a floating gate memory device which may include a dielectric layer having aluminum oxide or yttrium oxide, or aluminum oxide, yttrium oxide and tantalum pentoxide doped with Group IV elements such as zirconium or silicon. However, in the case of a non-volatile semiconductor memory device including a dielectric layer with metal oxide doped with Group IV elements, a band gap of the metal oxide decreases, which may deteriorate electrical characteristics of the dielectric layer, even though a dielectric constant of the dielectric layer may increase.

SUMMARY OF THE INVENTION

Example embodiments of the present invention may provide non-volatile semiconductor memory devices including a dielectric layer having a higher dielectric constant and a method of forming the same.

In an example embodiment of the present invention, a semiconductor memory device may include a tunnel oxide layer pattern disposed on a semiconductor substrate, a floating gate disposed on the tunnel oxide layer pattern, a dielectric layer pattern disposed on the floating gate, the dielectric layer pattern formed of metal oxide doped with a Group III transition metal, and a control gate disposed on the dielectric layer pattern. The semiconductor memory device may be a non-volatile memory device.

In another example embodiment of the present invention, a method of manufacturing a semiconductor memory device may include forming a tunnel oxide layer pattern on a substrate, forming a floating gate on the tunnel oxide layer pattern, forming a dielectric layer pattern on the floating gate, the dielectric layer pattern including metal oxide doped with a Group III transition metal, and forming a control gate on the dielectric layer pattern.

BRIEF DESCRIPTION OF THE DRAWINGS

The present invention may be more apparent by the description of the example embodiments thereof with reference to the accompanying drawings, in which.

DESCRIPTION OF EXAMPLE EMBODIMENTS

Figure 1:
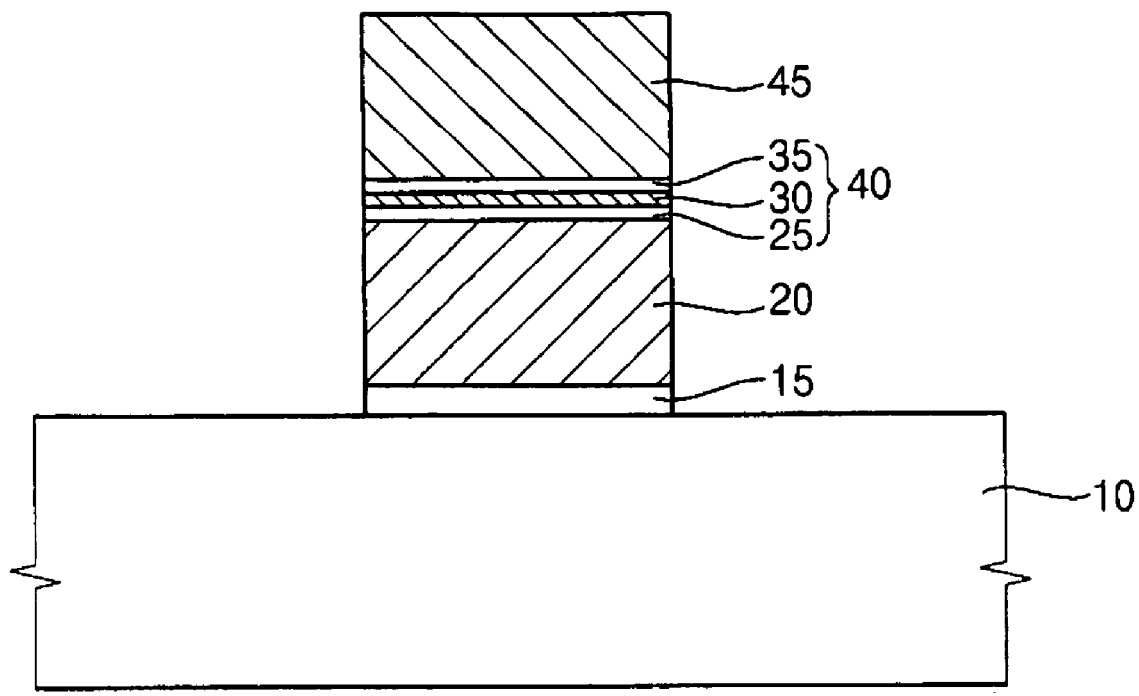
FIG. 1 is a cross-sectional view illustrating a memory cell of a non-volatile semiconductor memory device of the prior art.

The present invention will be described more fully hereinafter with reference to the accompanying drawings, in which example embodiments of the present invention are shown. The present invention may, however, be embodied in many different forms and should not be construed as limited to the example embodiments set forth herein. Rather, these example embodiments may be provided as working examples of the present invention. In the drawings, sizes and relative sizes of layers and regions may be exaggerated for clarity.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that may be schematic illustrations of idealized embodiments (and intermediate structures) of the present invention. As such, variations from the shapes of the illustrations as a result, for example, of manufacturing techniques and/or tolerances, are to be expected. Thus, the example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A to 2F are cross-sectional views illustrating a method of manufacturing a non-volatile semiconductor memory device in accordance with an example embodiment of the present invention.

Figure 2A:
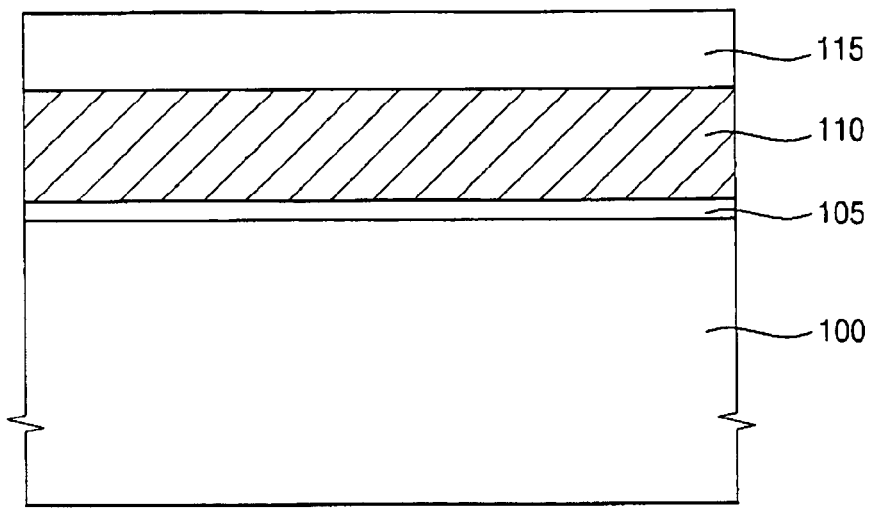
FIGS. 2A to 2F are cross-sectional views illustrating a method of manufacturing a non-volatile semiconductor memory device in accordance with an example embodiment of the present invention.

Referring to FIG. 2A, a tunnel oxide layer 105 may be formed on a semiconductor substrate 100, for example, such as a silicon wafer. The tunnel oxide layer 105 may have a thickness of about 30 to about 90 Å. The tunnel oxide layer 105 may have a thickness of about 60 Å. The tunnel oxide layer 105 may be formed using a thermal oxidation process or a chemical vapor deposition (CVD) process.

In the case of a non-volatile semiconductor memory device, the capacity to store data therein may depend on a reliability of the tunnel oxide layer 105. Therefore, a number of times that programming and erasing operations may be repeated may be limited depending on the reliability of the tunnel oxide layer 105. In general, a non-volatile semiconductor memory device programs and erases over about 1 million times. Accordingly, the tunnel oxide layer 105 in example embodiments of the present invention may be formed using a radical oxidation process at a temperature of over about 800° C. at a low pressure of below about 1 torr under an oxygen ($O_2$), hydrogen ($H_2$), and nitrogen ($N_2$) gaseous atmosphere.

If the tunnel oxide layer 105 is formed by a radical oxidation process, a thickness of the tunnel oxide layer 105 may be appropriately controlled, and fineness of the tunnel oxide layer 105 may be improved.

A first conductive layer 110 may be formed on the tunnel oxide layer 105. The first conductive layer 110 may be formed of polysilicon or amorphous silicon. The polysilicon layer or the amorphous silicon layer may be formed on the tunnel oxide layer 105 to a thickness of about 300 to about 700 Å by a chemical vapor deposition process. The polysilicon layer or the amorphous silicon layer may be formed on the tunnel oxide layer 105 to a thickness of about 500 Å by a chemical vapor deposition process. Afterwards, impurities may be doped into the polysilicon layer or the amorphous silicon layer by a $POCl_3$ diffusing process, an ion implanting process, or an in-situ doping process. As a result, the first conductive layer 110 may be formed on the tunnel oxide layer 105.

Referring to FIG. 2A, a hard mask layer 115 may be formed on the first conductive layer 110. The hard mask layer 115 may be formed using a material that has an etching selectivity relative to the first conductive layer 110, the tunnel oxide layer 105, and the semiconductor substrate 100. For example, the hard mask layer 115 may include silicon nitride or silicon oxynitride.

Figure 2B:
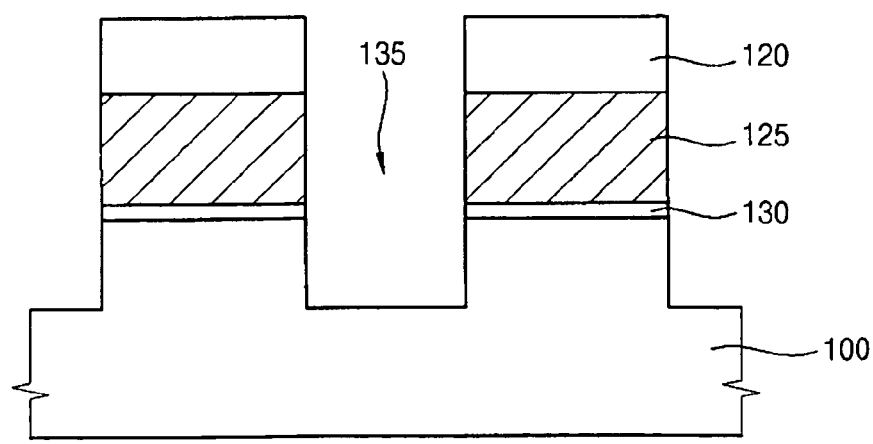
Figure 2C:
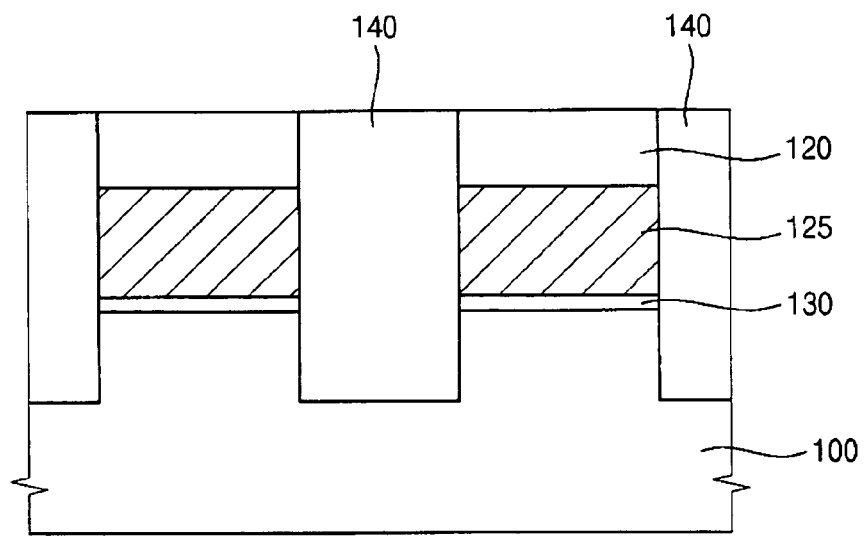
Figure 2D:
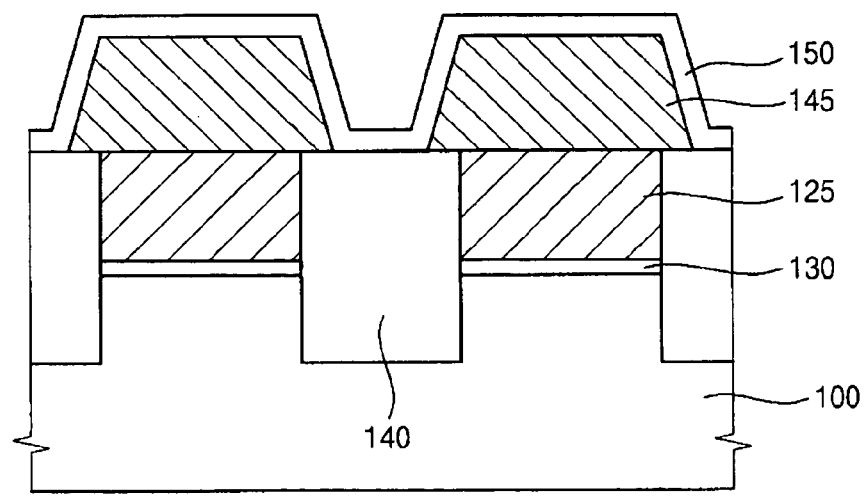
Figure 2E:
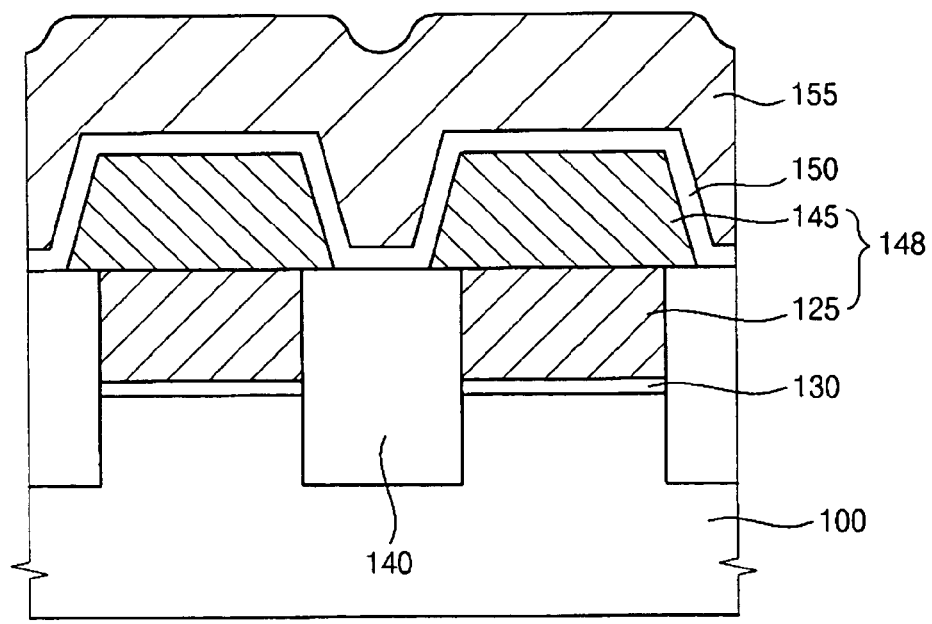
Figure 2F:
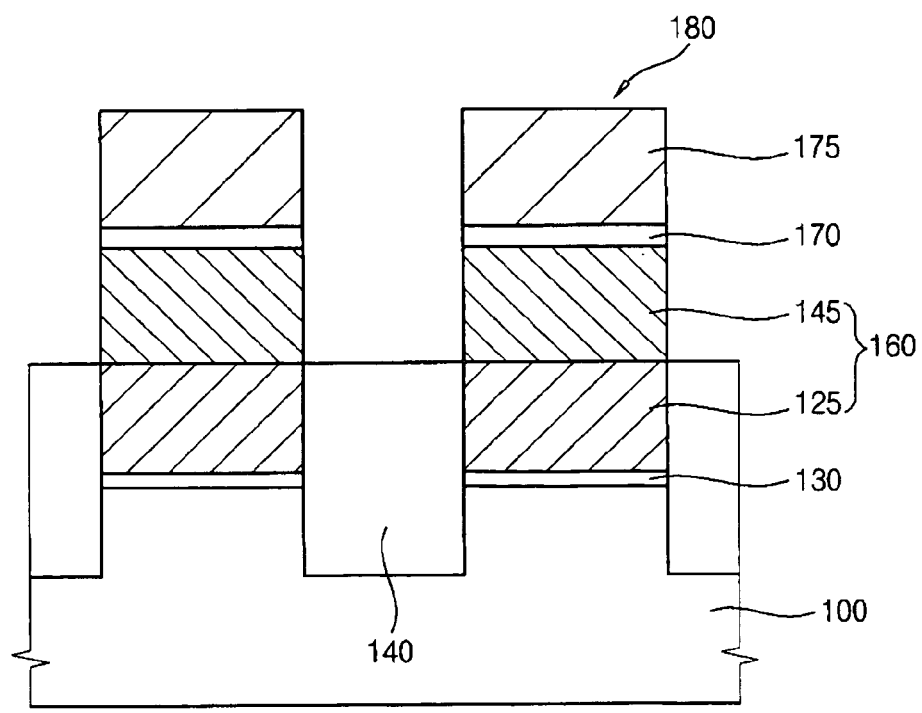

Referring to FIG. 2B, a first photoresist pattern (not shown) may be formed on the hard mask layer 115, and the hard mask layer 115 may be patterned using the first photoresist pattern as an etching mask to thereby form a hard mask 120 defining a floating gate (reference numeral 160 in FIG. 2F).

The first photoresist pattern may be removed using an ashing and/or stripping process, and then the first conductive layer 110 and the tunnel oxide layer 105 may be etched using the hard mask 120 as an etching mask to thereby form a first conductive layer pattern 125 and a tunnel oxide layer pattern 130. Portions of the semiconductor substrate 100 exposed during the formation of the tunnel oxide layer pattern 130 and a first conductive pattern 125 may be etched to form a trench 135 on the semiconductor substrate 100.

In more detail, the semiconductor substrate 100 may be transferred into an etching chamber to sequentially etch exposed portions of the first conductive layer 110, the tunnel oxide layer 105, and the semiconductor substrate 100. Using the hard mask 120 as an etching mask, the first conductive layer 110 and the tunnel oxide layer 105 may be sequentially etched by introducing an etchant gas for the first conductive layer 110 and the tunnel oxide layer 105 into the etching chamber. As a result, a tunnel oxide layer pattern 130 and a first conductive layer pattern 125 may be formed on the semiconductor substrate 100. Portions of the semiconductor substrate 100 may be etched to a depth of about 1,200 Å to about 2,500 Å from a surface of the semiconductor substrate 100 to form the trench 135. The depth of the trench 135 may be about 1,700 Å. Hence, if the trench 135 is formed on the semiconductor substrate 100, an active region and a floating gate forming region may be simultaneously defined.

According to an example embodiment of the present invention, the first conductive layer 110, the tunnel oxide layer 130, and a portion of the semiconductor substrate 110 may be sequentially etched using the hard mask 120 as an etching mask to sequentially form the trench 135, the tunnel oxide layer pattern 130, and the first conductive layer pattern 125. The trench 135 may be formed at the surface portion of semiconductor substrate 100, and the tunnel oxide layer pattern 130, and the first conductive layer pattern 125 may be subsequently formed on a portion of the semiconductor substrate 100 not having the trench 135.

According to another example embodiment of the present invention, the first photoresist pattern may be consumed and removed when the first conductive layer pattern 125, the tunnel oxide layer pattern 130, and the trench 135 are being formed. Thus, an additional process of removing the first photoresist pattern may be omitted.

Referring to FIG. 2C, an oxide layer may be formed on the semiconductor substrate 100 to fill the trench 135, and then the oxide layer may be partially removed using a chemical and mechanical polishing (CMP) process, an etchback process, or a combination process of CMP and etchback, to thereby form an isolation layer 140 filling the trench 135. In detail, an oxide material having a good gap-filling characteristic may be deposited using a chemical vapor deposition (CVD) process to form the oxide layer. The oxide layer may include a high-density plasma (HDP) oxide material. Upper portions of the oxide layer may be removed using a CMP process until an upper face of the hard mask 120 is exposed to thereby form the isolation layer 140 filling the trench 135. The hard mask 120 may be removed using a dry etch process or a wet etch process. The isolation layer 140 may have a height substantially similar to that of the first conductive layer pattern 125.

Referring to FIG. 2D, a second conductive layer may be formed on the first conductive layer pattern 125 and the isolation layer 140, and then the second conductive layer may be patterned by a photolithographic process to thereby form a second conductive layer pattern 145 on the first conductive layer pattern 125 and on a portion of the isolation layer 140. The second conductive layer pattern 145 may have a thickness of about 1,000 to about 1,400 Å. The second conductive layer pattern 145 may have a thickness about 1,200 Å. As a result, a preliminary floating gate 148 having the first conductive layer pattern 125 and the second conductive layer pattern 145 may be formed.

In more detail, a polysilicon layer or an amorphous silicon layer may be formed on the first conductive layer pattern 125 and the isolation layer 140 using a CVD process, and then impurities may be implanted into the polysilicon layer or the amorphous silicon layer to thereby form a second conductive layer (not shown). The impurities may be doped using a $POCl_3$ diffusing process, an ion implanting process, or an in-situ doping process. Subsequently, an etching mask (not shown) defining a layout of the preliminary floating gate 148 may be formed on the second conductive layer, and then the second conductive layer may be etched using the etching mask to form the second conductive layer pattern 145 on the first conductive layer pattern 125. When the etching mask is removed, the preliminary floating gate 148 having the first and second conductive layer patterns 125 and 145 may be formed.

A dielectric layer 150 may be formed on the first conductive layer pattern 145 and the isolation layer 140. The dielectric layer 150 may be formed of metal oxide doped with Group III transition metals by a physical vapor deposition (PVD) process. The dielectric layer 150 may be formed of aluminum oxide doped with Group III transition metals, for example, scandium (Sc), yttrium (Y) or lanthanum (La), using a pulsed laser deposition process. The dielectric layer 150 may include the transition Group III metals at a concentration of about 5 to about 15 percent by weight with respect to the aluminum oxide. The dielectric layer 150 may include the transition Group III metals at a concentration of about 6.25 percent by weight with respect to the aluminum oxide.

If a pulsed laser deposition process is used to form the dielectric layer 150, a laser having a wavelength of about 150 to about 350 nm and a pulsed width of about 5 to about 20 ns may be used to improve surface uniformity of the dielectric layer 150. For example, the dielectric layer 150 may be formed using an argon fluoride (ArF) laser, a krypton fluoride (KrF) laser, a krypton chloride (KrCl) laser, a xenon chloride (XeCl) laser, or a fluorine (F2) laser.

A conventional non-volatile semiconductor memory device may have an ONO structure having a sequentially stacked first oxide layer, nitride layer, and second oxide layer. However, a non-volatile semiconductor memory device in accordance with an example embodiment of the present invention may include a dielectric layer having metal oxide doped with Group III transition metals. Thus, a thickness of the dielectric layer may be decreased. Furthermore, a dielectric layer formed using the pulsed laser deposition processing accordance with an example embodiment of the present invention may maintain a more uniform composition thereof, and the dielectric layer may be formed at a relatively high deposition rate, while still controlling the thickness thereof.

According to another example embodiment of the present invention, a wet etching process may be additionally performed in order to remove a native oxide layer on on a semiconductor substrate having a second conductive layer pattern and isolation layer prior to the formation of a dielectric layer.

Referring to FIG. 2E, a third conductive layer 155 may be formed on the dielectric layer 150. The third conductive layer 155 may include a polysilicon layer doped with N+ type impurities, or the third conductive layer 155 may include a polysilicon layer and a metal silicide layer. The metal silicide layer may include tungsten silicide (WSiX), titanium silicide (TiSiX), cobalt silicide (CoSiX), tantalum or silicide (TaSiX).

Referring to FIG. 2F, a second photoresist pattern (not shown) may be formed on the third conductive layer 155, and then the third conductive layer 155 may be patterned using the second photoresist pattern as an etching mask, to thereby form a control gate 175 on the dielectric layer 150.

The dielectric layer 150 and the second conductive layer pattern 145 may be partially etched to form a dielectric layer pattern 170 and a floating gate 160. The dielectric layer pattern 170 and the second conductive layer pattern 145 may be etched by a dry etching process.

A non-volatile semiconductor memory device may have to maintain a relatively high coupling coefficient between a floating gate and a control gate in order to induce voltage applied to the control gate to the floating gate. A coupling coefficient (R) of the non-volatile semiconductor memory device may be described with respect to equation 1.

$$R = C_{DIE}/(C_{DIE} + C_{TO})$$ [Equation 1]

wherein the reference symbol CDIE represents capacitance of a dielectric layer, and CTO represents capacitance of a tunnel oxide layer.

As may be seen in equation 1, the capacitance of the dielectric layer (CDIE) should increase in order to increase the coupling coefficient (R). That is, in order to obtain a higher coupling coefficient (R), the dielectric layer should include a material having a higher dielectric constant. In addition, either an increase in an area of the dielectric layer or a decrease in a thickness of the dielectric layer may enhance the coupling coefficient (R). According to example embodiments of the present invention, aluminum oxide having a relatively high dielectric constant of about 9 doped with Group III transition metals and having a relatively high dielectric constant may be used to form the dielectric layer.

Figure 3:
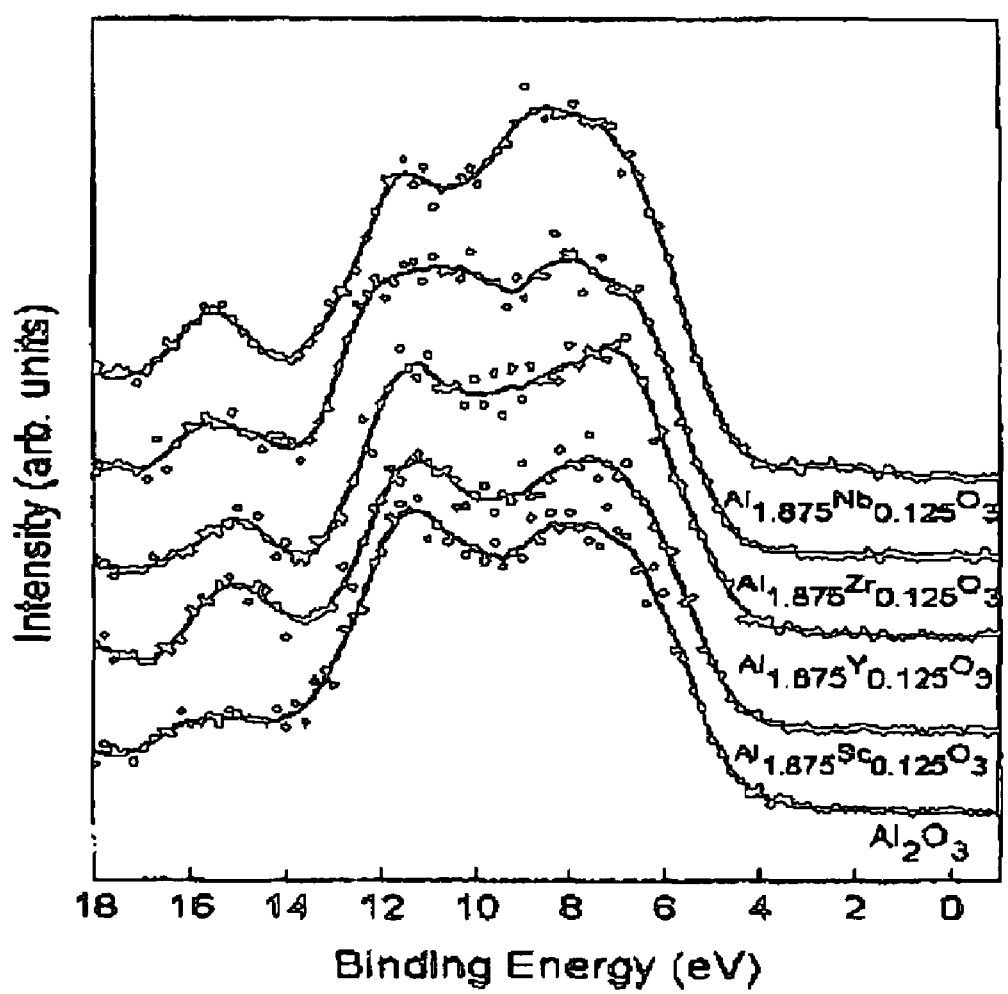
FIG. 3 is a graph illustrating a band gap variation of valence bands of aluminum oxide doped with Group III transition metals, a band gap variation of valence bands of aluminum oxide doped with Group IV transition metals and a band gap variation of valence bands of aluminum oxide doped with Group V transition metals.
Figure 4:
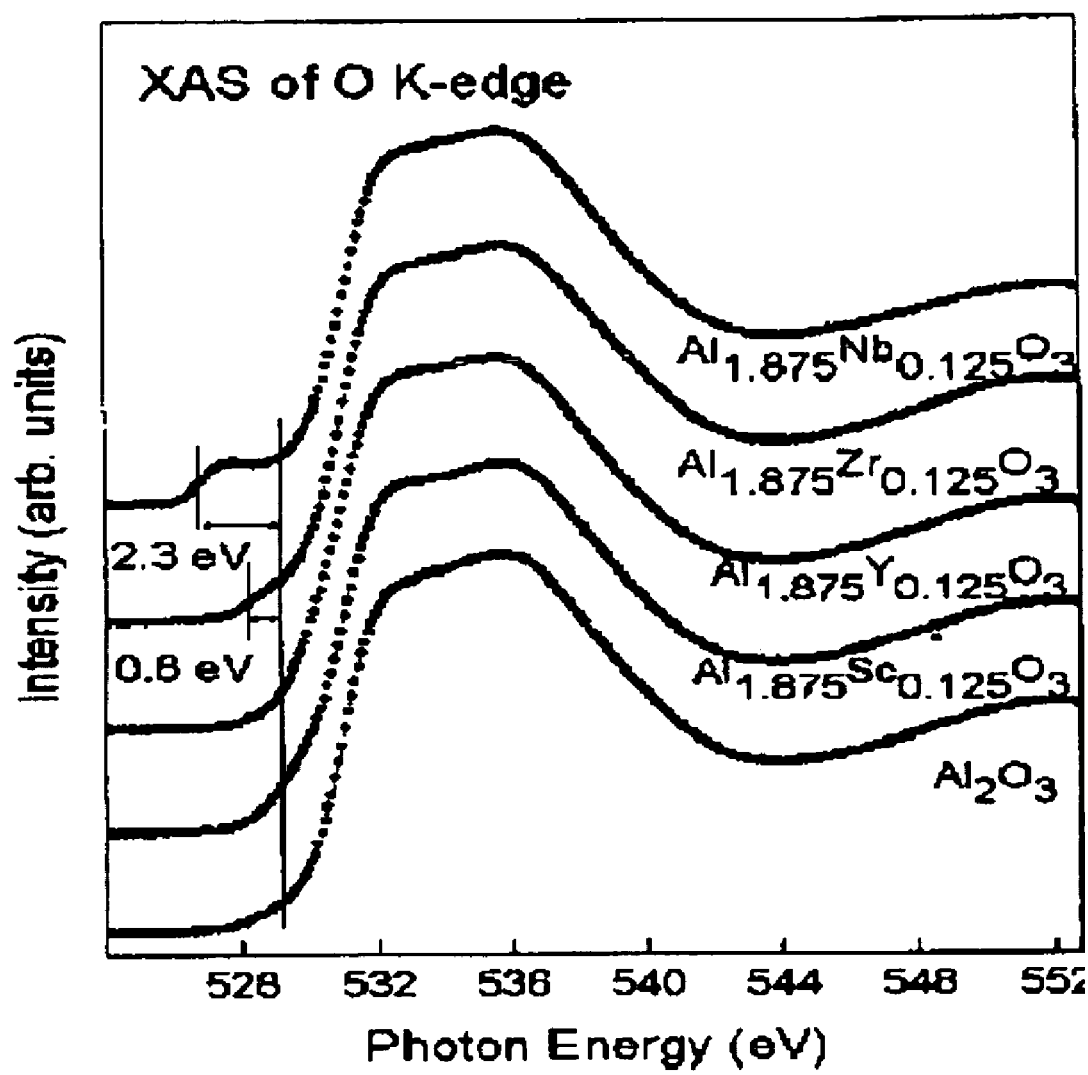
FIG. 4 is a graph illustrating a band gap variation of conduction bands of aluminum oxide doped with Group III transition metals, a band gap variation of conduction bands of aluminum oxide doped with Group IV transition metals, and a band gap variation of conduction bands of aluminum oxide doped with Group V transition metals.

FIG. 3 is a graph illustrating a band gap variation of valence bands of aluminum oxide doped with Group III transition metals, a band gap variation of valence bands of aluminum oxide doped with Group IV transition metals and a band gap variation of valence bands of aluminum oxide doped with Group V transition metals. FIG. 4 is a graph illustrating a band gap variation of conduction bands of aluminum oxide doped with Group III transition metals, a band gap variation of conduction bands of aluminum oxide doped with Group IV transition metals, and a band gap variation of conduction bands of aluminum oxide doped with Group V transition metals. In FIGS. 3 and 4, yttrium (Y) and scandium (Sc) were used as Group III transition metals, zirconium (Zr) was used as a Group IV transition metal, and niobium (Nb) was used as a Group V transition metal. In addition, the band gap variations as described in FIGS. 3 and 4 were measured using X-ray photoelectron spectroscopy (XPS) and X-ray absorption spectroscopy (XAS), respectively.

As shown in FIGS. 3 and 4, a band offset variation of valence bands of aluminum oxide doped with four kinds of transition metals does not substantially occur. However, the band offset of conduction bands of zirconium, one of Group IV transition metals, or niobium, one of Group V transition metals is reduced compared with that of pure aluminum oxide. Thus, it may be noted that aluminum oxide doped with a Group III transition metal such as scandium, yttrium, etc. may have a dielectric constant higher than that of pure aluminum oxide without lowering the band gap.

The foregoing may be illustrative of example embodiments of the present invention and may not to be construed as limiting thereof. Although example embodiments have been described, those skilled in the art will readily appreciate that many modifications may be possible without materially departing from the novel teachings and aspects of the example embodiments of the present invention. Accordingly, all such modifications are intended to be included within the scope of the example embodiment of the present invention. In the claims, means-plus-function clauses are intended to cover the structures described herein as performing the recited function and not only structural equivalents but also equivalent structures. Therefore, it may be to be understood that the foregoing are illustrative of the example embodiments present invention and are not to be construed as limited to the example embodiments disclosed, and that modifications to the disclosed embodiments, as well as other embodiments, are intended to be included within the scope of the present invention.

What is claimed is:

1. A method of manufacturing a semiconductor memory device comprising:
    forming a tunnel oxide layer pattern on a substrate;
    forming a floating gate on the tunnel oxide layer pattern;
    forming a dielectric layer pattern on the floating gate, the dielectric layer pattern including metal oxide doped with a Group III transition metal, a concentration of the Group III transition metal doped into the metal oxide being about 5 to 15 percent by weight with respect to the metal oxide; and
    forming a control gate on the dielectric layer pattern.

2. The method of claim 1, wherein forming the tunnel oxide layer pattern and forming the floating gate include:
    forming a tunnel oxide layer on the substrate;
    forming a first conductive layer on the tunnel oxide layer;
    forming a hard mask on the first conductive layer; and
    forming the tunnel oxide layer pattern and the first conductive layer pattern on the substrate by partially etching the first conductive layer and the tunnel oxide layer using the hard mask as an etching mask.

3. The method of claim 2, wherein forming the first conductive layer further includes:
    forming a layer containing silicon on the tunnel oxide layer; and
    doping impurities into the silicon-containing layer.

4. The method of claim 3, wherein the silicon-containing layer is formed by a chemical vapor deposition process, and the impurities are doped into the silicon-containing layer by a POCl$_3$ diffusing process, an ion implantation process or an in-situ doping process.

5. The method of claim 2, wherein forming the floating gate further includes:
   forming a second conductive layer on the first conductive layer pattern; and
   forming a second conductive layer pattern on the first conductive layer pattern by patterning the second conductive layer.

6. The method of claim 1, wherein forming the dielectric layer pattern includes:
   forming a metal oxide layer on the floating gate;
   forming a dielectric layer by doping the Group III transition metal into the metal oxide layer; and
   patterning the dielectric layer.

7. The method of claim 6, where forming the dielectric layer includes performing a physical vapor deposition process or a pulsed laser deposition process.

8. The method of claim 1, wherein the metal oxide includes aluminum oxide, and the Group III transition metals include at least one of scandium, yttrium, and lanthalum.

9. The method of claim 1, wherein forming the control gate comprises:
   forming a third conductive layer on the dielectric layer pattern; and
   forming a third conductive layer pattern by patterning the third conductive layer.

10. The method of claim 9, wherein the third conductive layer includes doped polysilicon or polysilicon and a metal silicide.

11. The method of claim 1, wherein prior to forming the dielectric layer pattern, removing a native oxide layer on the substrate by wet etching the substrate.

12. The metal of claim 1, wherein the metal oxide includes aluminum oxide, and the Group III transition metal includes at least one of scandium, yttrium and lanthalum.

* * * * *